US012563951B2

(12) United States Patent
Tian et al.

(10) Patent No.:  US 12,563,951 B2
(45) Date of Patent:      Feb. 24, 2026

(54) DISPLAY SUBSTRATE AND MANUFACTURING METHOD THEREFOR, AND DISPLAY DEVICE

(71) Applicant: BOE Technology Group Co., Ltd., Beijing (CN)

(72) Inventors: Xueyan Tian, Beijing (CN); Jianchao Zhu, Beijing (CN); Yanyan Yang, Beijing (CN); Dengyun Chen, Beijing (CN); Shuo Huang, Beijing (CN); Chengjie Qin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 498 days.

(21) Appl. No.: 17/631,434

(22) PCT Filed: Apr. 13, 2021

(86) PCT No.: PCT/CN2021/086765
§ 371 (c)(1),
(2) Date: Jan. 28, 2022

(87) PCT Pub. No.: WO2021/238465
PCT Pub. Date: Dec. 2, 2021

(65) Prior Publication Data
US 2022/0285653 A1      Sep. 8, 2022

(30) Foreign Application Priority Data

May 28, 2020    (CN) .......................... 202010465178.9

(51) Int. Cl.
H10K 59/80          (2023.01)
H10K 59/122        (2023.01)
(Continued)

(52) U.S. Cl.
CPC ....... H10K 59/8791 (2023.02); H10K 59/122 (2023.02); H10K 59/874 (2023.02);
(Continued)

(58) Field of Classification Search
CPC .. H10K 50/846; H10K 59/874; H10K 59/122; H10K 50/86; H10K 59/8791;
(Continued)

(56) References Cited

U.S. PATENT DOCUMENTS

2008/0279229 A1*  11/2008  Suzuki ................ H01S 5/18327
                                                                372/19
2010/0320554 A1*  12/2010  Toumiya ............. H10F 39/8063
                                                                257/E31.127
(Continued)

FOREIGN PATENT DOCUMENTS

CN            2693113  Y      4/2005
CN          107275512  A      10/2017
(Continued)

OTHER PUBLICATIONS

International Search Report for PCT/CN2021/086765 Mailed Jul. 1, 2021.
(Continued)

*Primary Examiner* — Matthew C Landau
*Assistant Examiner* — David W Ward
(74) *Attorney, Agent, or Firm* — Ling Wu; Stephen Yang; Ling and Yang Intellectual Property

(57)                    ABSTRACT
A display substrate includes a base substrate, a light-emitting structure layer located on the base substrate, an encapsulation structure layer located on the light-emitting structure layer, a reflection layer located on the encapsulation structure layer, a hydrophilic material layer located on the reflection layer, and an optical adhesive layer located on the hydrophilic material layer.

14 Claims, 7 Drawing Sheets

(51) Int. Cl.
*H10K 59/12* (2023.01)
*H10K 102/00* (2023.01)

(52) U.S. Cl.
CPC ........... *H10K 59/878* (2023.02); *H10K 59/12* (2023.02); *H10K 59/871* (2023.02); *H10K 2102/351* (2023.02)

(58) Field of Classification Search
CPC .......... H10K 2102/351; H10K 50/844; H10K 50/8445; H10K 59/873; H10K 59/8731; H10K 59/00; H10K 50/856; H10K 59/878; H10K 59/12; H10K 59/871; H10K 59/872; H10K 59/131; H10K 59/1315
See application file for complete search history.

(56) References Cited

U.S. PATENT DOCUMENTS

| | | | |
|---|---|---|---|
| 2018/0219171 A1* | 8/2018 | Kim | H10K 59/50 |
| 2018/0342560 A1 | 11/2018 | Ma et al. | |
| 2019/0156096 A1* | 5/2019 | Lin | G06V 40/1318 |
| 2020/0020739 A1* | 1/2020 | Chen | H10H 29/142 |
| 2020/0083484 A1* | 3/2020 | Lee | H10K 50/8445 |
| 2020/0099007 A1* | 3/2020 | Zhao | H10H 20/853 |
| 2020/0176641 A1* | 6/2020 | Lee | H01L 25/0753 |
| 2020/0212147 A1* | 7/2020 | Han | H10K 59/122 |
| 2020/0251679 A1* | 8/2020 | Ha | G06F 1/1652 |
| 2020/0357766 A1* | 11/2020 | Su | H01L 23/3142 |
| 2020/0411596 A1* | 12/2020 | Guo | H10K 59/40 |
| 2021/0057498 A1* | 2/2021 | Pahk | H10K 50/846 |
| 2021/0083012 A1* | 3/2021 | Byun | H10K 59/8731 |
| 2021/0359010 A1* | 11/2021 | Kang | G02B 5/206 |
| 2021/0367008 A1 | 11/2021 | Hu et al. | |

FOREIGN PATENT DOCUMENTS

| | | | | |
|---|---|---|---|---|
| CN | 108493230 A | | 9/2018 | |
| CN | 109031740 A | | 12/2018 | |
| CN | 110767841 A | | 2/2020 | |
| CN | 110828695 A | | 2/2020 | |
| CN | 110838509 A | | 2/2020 | |
| CN | 111048559 A | * | 4/2020 | ......... H01L 27/3244 |
| CN | 111584602 A | | 8/2020 | |

OTHER PUBLICATIONS

The First Office Action dated Mar. 18, 2022 for Chinese Patent Application No. 202010465178.9 and English Translation.

* cited by examiner

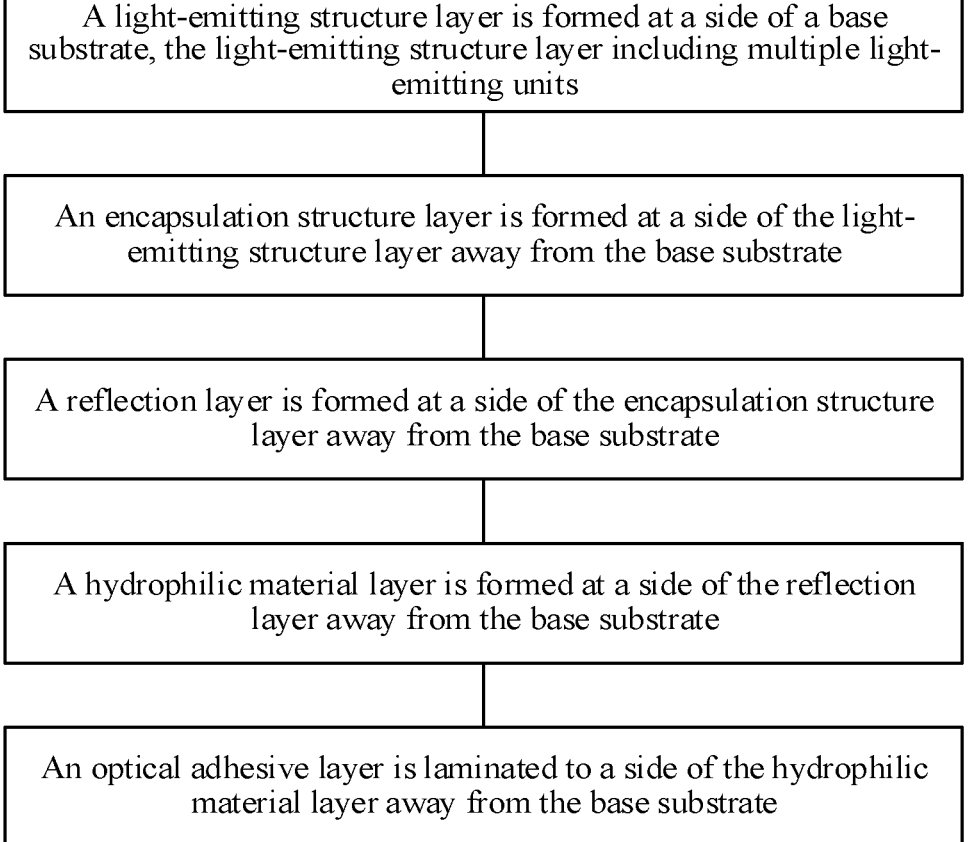

A light-emitting structure layer is formed at a side of a base substrate, the light-emitting structure layer including multiple light-emitting units An encapsulation structure layer is formed at a side of the light-emitting structure layer away from the base substrate A reflection layer is formed at a side of the encapsulation structure layer away from the base substrate A hydrophilic material layer is formed at a side of the reflection layer away from the base substrate An optical adhesive layer is laminated to a side of the hydrophilic material layer away from the base substrate

FIG. 12

DISPLAY SUBSTRATE AND MANUFACTURING METHOD THEREFOR, AND DISPLAY DEVICE

CROSS-REFERENCE TO RELATED APPLICATIONS

This application is a national stage application of PCT Application No. PCT/CN2021/086765, which is filed on Apr. 13, 2021 and claims priority to Chinese Patent Application No. 202010465178.9, filed to the China National Intellectual Property Administration on May 28, 2020 and entitled "Display Panel and Manufacturing Method Therefor, and Display Device", the contents of which are hereby incorporated by reference in their entirety.

TECHNICAL FIELD

The present disclosure relates, but not limited, to the technical field of display, and particularly to a display substrate, a manufacturing method therefor, and a display device.

BACKGROUND

Organic Light Emitting Diode (OLED) display substrate is applied extensively to the field of display of mobile phones, tablet computers, digital cameras and the like by virtue of the advantages of low energy consumption, low production cost, auto-luminescence, wide viewing angle, quick response, etc.

With the rapid development of display technologies, various novel technologies have emerged, and multifunctional display device has become one of goals people pursue. At present, mirror display device on the market may realize both a display function and a mirror function and thus is applied extensively. Mirror displaying refers to that a user may view a display image in a display of a mirror at the same time of using the mirror, thereby meeting various requirements of users, such as an advertisement display screen in a public place, a vehicular rear-view mirror and a display screen of an Automatic Teller Machine (ATM).

An OLED mirror display screen reflects light by a reflection layer so as to realize a mirror function. An upper side of the reflection layer needs to be laminated with an optical adhesive layer (such as an optically clear adhesive, OCA). When the optical adhesive layer is laminated, bad pressure for lamination may damage the reflection layer or cause bubbles, separation and other undesirable phenomena, thereby reducing the reliability yield of the product.

SUMMARY

The below is a summary about the subject matter described in the present disclosure in detail. The summary is not intended to limit the scope of protection of the claims.

According to a first aspect, an embodiment of the present disclosure provides a display substrate, which includes:

a base substrate;

a light-emitting structure layer, located at a side of the base substrate and including multiple light-emitting units;

an encapsulation structure layer, located at a side of the light-emitting structure layer away from the base substrate;

a reflection layer, located at a side of the encapsulation structure layer away from the base substrate;

a hydrophilic material layer, located at a side of the reflection layer away from the base substrate; and an optical adhesive layer, located at a side of the hydrophilic material layer away from the base substrate.

In some possible implementation modes, a material of the hydrophilic material layer includes a silicon-series super-hydrophilic oxide. Alternatively, a material of the hydrophilic material layer includes a hydrophilic organic colloid (OC).

In some possible implementation modes, a thickness of the hydrophilic material layer ranges from 1,200 angstroms to 1,700 angstroms.

In some possible implementation modes, the display substrate includes a display region, a border region located on a periphery of the display region, and a bonding region. The hydrophilic material layer is located in the display region, the border region and the bonding region. The hydrophilic material layer is provided with a second exposure hole located in the bonding region and configured to expose a bonding pad of the bonding region.

In some possible implementation modes, an orthographic projection of the hydrophilic material layer on the base substrate includes that of the reflection layer on the base substrate. The orthographic projection of the reflection layer on the base substrate includes that of the encapsulation structure layer on the base substrate.

In some possible implementation modes, the reflection layer is located in a display region, a border region and a bonding region. The reflection layer is provided with light holes located in the display region and corresponding to the light-emitting units one to one. The reflection layer is further provided with a first exposure hole located in the bonding region and configured to expose a bonding pad of the bonding region.

In some possible implementation modes, a material of the reflection layer includes one or more of the following materials: molybdenum (Mo), aluminum (Al), argentum (Ag), titanium (Ti), an indium tin oxide (ITO)/argentum/indium tin oxide multilayer composite, and a titanium/aluminum/titanium multilayer composite.

In some possible implementation modes, a thickness of the reflection layer ranges from 0.25 μm to 0.4 μm.

In some possible implementation modes, the display substrate further includes a protective layer located between the encapsulation structure layer and the reflection layer. A material of the protective layer includes at least one of the following materials: silicon nitride (SiNx), silicon oxide (SiOx), and a silicon nitride/silicon oxide composite layer.

In some possible implementation modes, a thickness of the protective layer ranges from 0.2 μm to 0.4 μm.

In some possible implementation modes, an orthogonal projection of the protective layer on the base substrate includes that of the encapsulation structure layer on the base substrate.

In some possible implementation modes, the encapsulation structure layer includes a first inorganic encapsulation layer, organic encapsulation layer and second inorganic encapsulation layer which are sequentially stacked at the side of the light-emitting structure layer away from the base substrate.

In some possible implementation modes, the base substrate includes a base structure layer and a driving structure layer located at a side of the base structure layer facing the light-emitting structure layer. The base structure layer includes a first base, second base, third base and buffer layer which are sequentially stacked. The driving structure layer is located at a side of the buffer layer away from the first base.

Each of the first base, the second base and the third base includes at least one of the following materials: a pressure sensitive adhesive (PSA), polyimide (PI), polyethylene terephthalate (PET), and a polymer soft film subjected to surface treatment.

According to another aspect, an embodiment of the present disclosure also provides a display device, which includes the above-mentioned display substrate.

According to another aspect, an embodiment of the present disclosure also provides a manufacturing method for a display substrate, which includes the following operations.

A light-emitting structure layer is formed at a side of a base substrate. Herein, the light-emitting structure layer includes multiple light-emitting units.

An encapsulation structure layer is formed at a side of the light-emitting structure layer away from the base substrate.

A reflection layer is formed at a side of the encapsulation structure layer away from the base substrate.

A hydrophilic material layer is formed at a side of the reflection layer away from the base substrate.

An optical adhesive layer is laminated to a side of the hydrophilic material layer away from the base substrate.

In some possible implementation modes, the display substrate includes a display region, a border region located on a periphery of the display region, and a bonding region. The operation that a hydrophilic material layer is formed at a side of the reflection layer away from the base substrate includes the following operations.

A hydrophilic material thin film located in the display region, the border region and the bonding region is formed at the side of the reflection layer away from the base substrate.

The hydrophilic material thin film is patterned through a patterning process to form the hydrophilic material layer. Herein, the hydrophilic material layer is provided with a second exposure hole located in the bonding region and configured to expose a bonding pad of the bonding region.

Other features and advantages of the technical solutions of the present disclosure will be elaborated in the following specification and, moreover, partially become apparent from the specification or are understood by implementing the technical solutions of the present disclosure. The objectives and advantages of the technical solutions of the present disclosure may be achieved through structures particularly pointed out in the specification and the drawings.

Other aspects will become apparent upon reading and understanding the drawings and the detailed description.

BRIEF DESCRIPTION OF DRAWINGS

The drawings, which constitute a part of the specification, are used to provide further understandings to the technical solutions of the present disclosure and explain, together with the embodiments of the present disclosure, the technical solutions of the present disclosure and do not form limits to the technical solutions of the present disclosure.

FIG. 12 is a schematic diagram of a manufacturing method for a display substrate according to an exemplary embodiment of the present disclosure.

DETAILED DESCRIPTION

Figure 1:
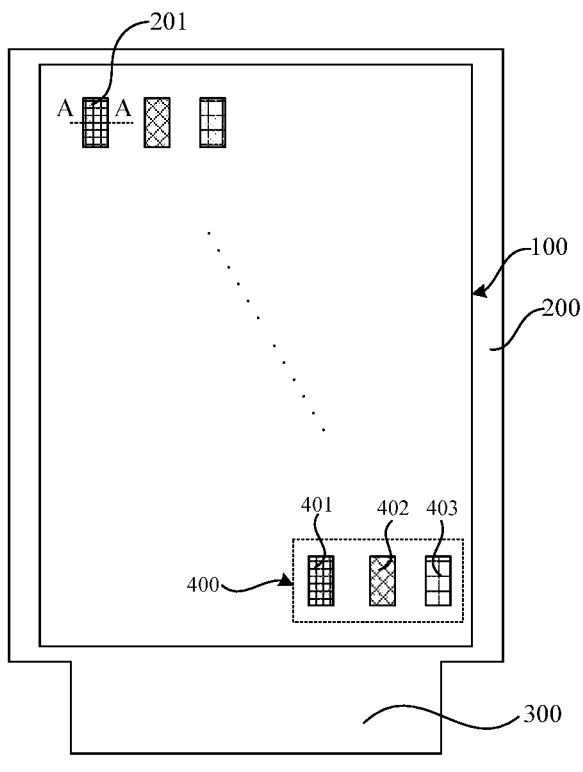
FIG. 1 is a structural schematic top view of a display substrate according to an exemplary embodiment of the present disclosure.

In order to make the objectives, technical solutions and advantages of the present disclosure clearer, the embodiments of the present disclosure will be described below in combination with the drawings in detail. The implementation modes may be implemented in various forms. Those of ordinary skill in the art may easily understand such a fact that modes and contents may be transformed into various forms without departing from the objective and scope of the present disclosure. Therefore, the present disclosure should not be explained as being limited to the contents recorded in the following implementation modes only. The embodiments in the present disclosure and the features in the embodiments may be freely combined without conflicts.

In the drawings, the sizes of composition elements, the thicknesses of layers or regions are exaggerated sometimes for clarity. Therefore, the implementation mode of the present disclosure is not always limited to the size, and the shapes and sizes of each component in the drawings do not reflect the true scale. In addition, the drawings schematically illustrate ideal examples, and the implementation mode of the present disclosure is not limited to the shapes or numerical values shown in the drawings.

Ordinal numerals "first", "second" and "third" in the present disclosure are set not to form limits in number but only to avoid the confusion of composition elements.

In the present disclosure, for convenience, expressions "central", "above", "below", "front", "back", "vertical", "horizontal", "top", "bottom", "inside", "outside" and the like indicating directional or positional relationships are used to illustrate positional relationships between the composition elements. These terms are not to indicate or imply that involved devices or elements must have specific orientations and be structured and operated with the specific orientations but only to easily and simply describe the present specification, and thus should not be understood as limits to the present disclosure. The positional relationships between the composition elements may be changed as appropriate according to the direction of description of each composition element. Therefore, appropriate replacements based on situations are allowed, not limited to the expressions in the specification.

In the present disclosure, unless otherwise specified and defined, terms "mounting", "mutual connection" and "connection" should be understood broadly. For example, the term may be fixed connection, or detachable connection or integration connection. Alternatively, the term may be mechanical connection or electric connection. Alternatively, the term may be direct connection, or indirect connection through an intermediate, or communication inside two elements. Those of ordinary skill in the art may understand the meanings of the terms in the present disclosure according to specific situations.

In the present disclosure, the transistor refers to an element at least including three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. In the present disclosure, the channel region refers to a main region that the current flows through.

In the present disclosure, a first electrode is a drain electrode, and a second electrode is a source electrode. Alternatively, a first electrode is a source electrode, and a second electrode is a drain electrode. In case that transistors with opposite polarities are used, or a current direction changes during the work of a circuit, or the like, functions of the "source electrode" and the "drain electrode" may sometimes be exchanged. Therefore, the "source electrode" and the "drain electrode" may be exchanged in the present disclosure.

In the present disclosure, "electric connection" includes connection of composition elements through an element with a certain electric action. "The element with the certain electric action" is not particularly limited as long as electric signals between the connected composition elements may be sent and received. Examples of "the element with the certain electric action" not only include an electrode and a line, but also include a switch element such as a transistor, a resistor, an inductor, a capacitor, other elements with various functions, etc.

In the present disclosure, "parallel" refers to a state that an angle formed by two straight lines is larger than −10° and smaller than 10°, and thus may also include a state that the angle is larger than −5° and smaller than 5°. In addition, "perpendicular" refers to a state that an angle formed by two straight lines is larger than 80° and smaller than 100°, and thus may also include a state that the angle is larger than 85° and smaller than 95°.

Figure 10:
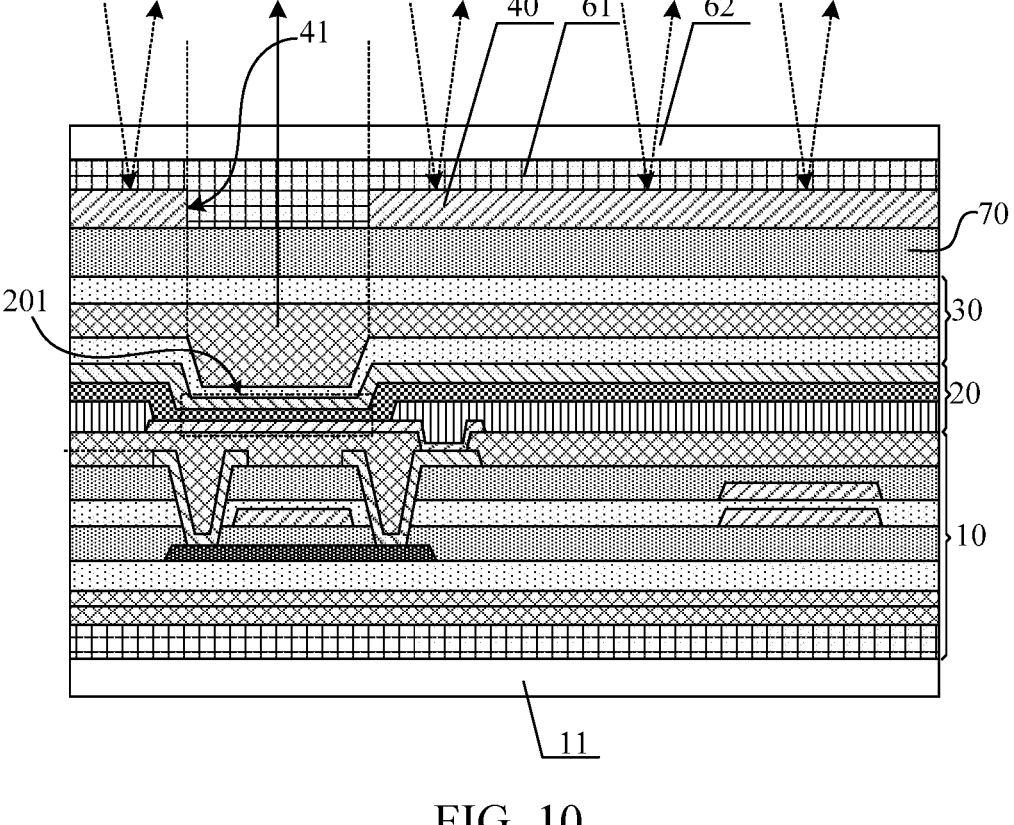
FIG. 10 is a sectional structural schematic diagram of a display substrate.

FIG. 10 is a sectional structural schematic diagram of a display substrate. As shown in FIG. 10, the display substrate includes a base substrate 10, a light-emitting structure layer 20, and an encapsulation structure layer 30. The light-emitting structure layer 20 is located at a side of the base substrate 10. The light-emitting structure layer 20 includes multiple light-emitting units 201. The encapsulation structure layer 30 is located at a side of the light-emitting structure layer 20 away from the base substrate 10. The display substrate further includes a reflection layer 40, an optical adhesive layer 61, and a cover plate 62. The reflection layer 40 is located at a side of the encapsulation structure layer 30 away from the base substrate 10. The optical adhesive layer 61 is laminated to a side of the reflection layer 40 away from the base substrate 10. The cover plate 62 is laminated to the optical adhesive layer 61.

The light-emitting units emit light for displaying. External light is reflected by the reflection layer 40 after irradiating the reflecting layer 40. As shown in FIG. 10, the display substrate shown in FIG. 10 is a mirror display substrate with both display and mirror functions.

When the display substrate shown in FIG. 10 is formed, the optical adhesive layer 61 is directly laminated to an upper side of the reflection layer 40. When the optical adhesive layer 61 is laminated, bad pressure for lamination may damage the reflection layer 40 or cause bubbles, separation and other undesirable phenomena, thereby reducing the reliability yield of the product.

Figure 2:
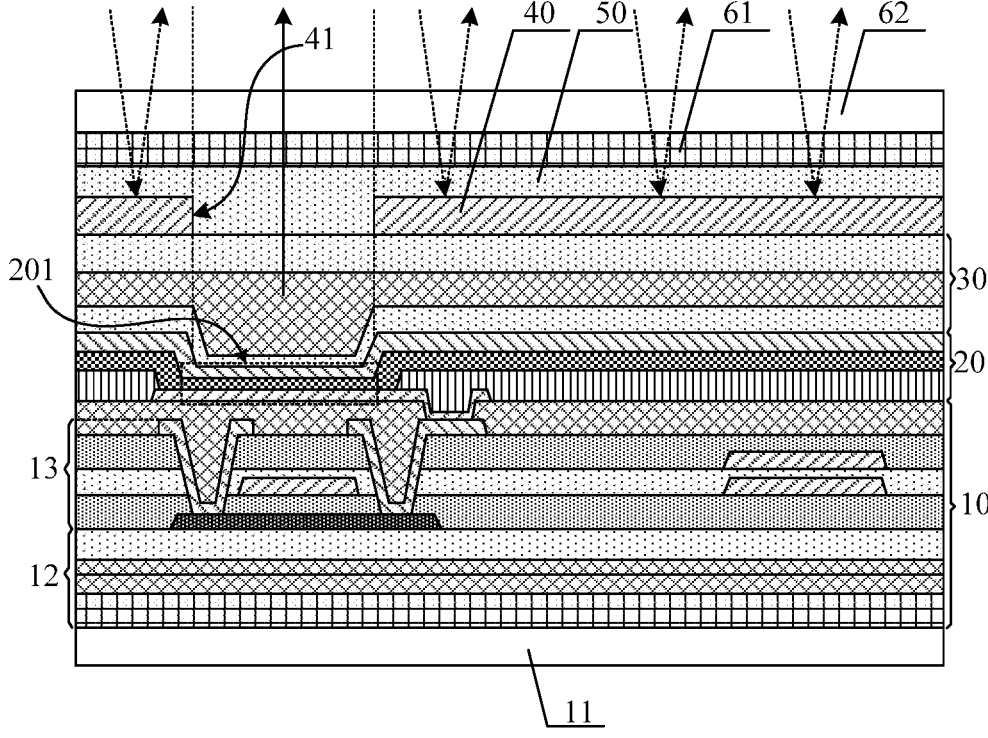
FIG. 2 is a structural schematic diagram of an A-A section of FIG. 1 according to an exemplary embodiment.

FIG. 1 is a structural schematic top view of a display substrate according to an exemplary embodiment of the present disclosure. FIG. 2 is a structural schematic diagram of an A-A section of FIG. 1 according to an exemplary embodiment. FIG. 2 shows only one light-emitting unit and one thin-film transistor as an example. The present disclosure provides a display substrate. As shown in FIGS. 1 and 2, the display substrate includes a display region 100, a border region 200 located on a periphery of the display region 100, and a bonding region 300. The display substrate includes a base substrate 10, a light-emitting structure layer 20, and an encapsulation structure layer 30. The light-emitting structure layer 20 is located at a side of the base substrate 10. The light-emitting structure layer 20 includes multiple light-emitting units 201 located in the display region 100. The encapsulation structure layer 30 is located at a side of the light-emitting structure layer 20 away from the base substrate 10. The display substrate further includes a reflection layer 40. The reflection layer 40 is located at a side of the encapsulation structure layer 30 away from the base substrate 10. The display substrate further includes a hydrophilic material layer 50, an optical adhesive layer 61, and a cover plate 62. The hydrophilic material layer 50 is located at a side of the reflection layer 40 away from the base substrate 10. The optical adhesive layer 61 is located at a side of the hydrophilic material layer 50 away from the base substrate 10. The cover plate 62 is located at a side of the optical adhesive layer 61 away from the base substrate 10.

According to the display substrate of the embodiment of the present disclosure, the hydrophilic material layer 50 is arranged at the side of the reflection layer 40 away from the base substrate 10, and the optical adhesive layer 61 is laminated to a surface of the hydrophilic material layer 50. Compared with the direct lamination of the optical adhesive layer 61 to the reflection layer 40, the hydrophilic material layer 50 may improve the adhesive power of the optical adhesive layer 61 on the surface of the hydrophilic material layer 50 and avoid bubbles, separation and other undesirable phenomena at an interface between the optical adhesive layer 61 and the hydrophilic material layer 50. In addition, the hydrophilic material layer 50 may protect the reflection layer 40 to avoid the reflection layer being damaged by bad pressure during the lamination of the optical adhesive layer 61. Therefore, the display substrate of the embodiment of the present disclosure may greatly improve the lamination and reliability yield of back-end modules.

In an exemplary embodiment, a material of the hydrophilic material layer 50 may be a silicon-series super-hydrophilic oxide such as Silicon Dioxide ($SiO_2$), or a hydrophilic Organic Colloid (OC) such as a transparent photo-resist. In an exemplary embodiment, a thickness of the hydrophilic material layer may range from 1,200 angstroms to 1,700 angstroms, such as 1,200 angstroms, 1,300 angstroms, 1,400 angstroms, 1,500 angstroms, 1,600 angstroms, or 1,700 angstroms.

In an exemplary embodiment, the reflection layer 40 is provided with light holes 41 corresponding to the light-emitting units 201 one to one. The reflection layer 40 is further provided with a first exposure hole 42 located in the bonding region. The first exposure hole 42 is configured to expose a bonding pad for bonding connection with a driver Integrated Circuit (IC) and a flexible circuit board.

Figure 11:
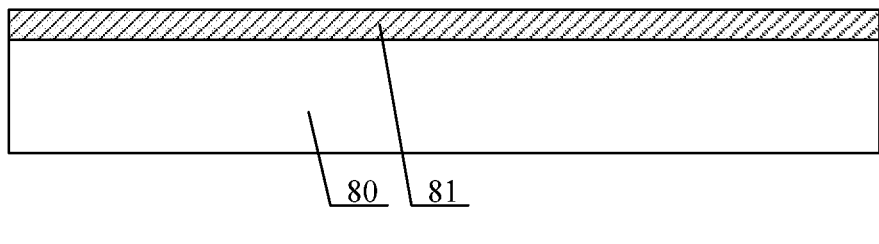
FIG. 11 is a structural schematic diagram of a mirror display device according to a conventional art.

FIG. 11 is a structural schematic diagram of a mirror display device. As shown in FIG. 11, the mirror display device includes a display substrate 80 and a half transmission half reflection film 81 located at a light output side of the display substrate 80. Display light of the display substrate is transmitted through the half transmission half reflection film 81 for displaying. External light is reflected after irradiating the half transmission half reflection film 81. Therefore, display and mirror effects are achieved at the same time. However, the use of the half transmission half reflection film may reduce the transmittance of the display device. Moreover, part of the external light may be transmitted through the half transmission half reflection film, and the display light of the display substrate is affected by the external light. As a result, the display contrast of the mirror display device is relatively low.

According to the display substrate in the embodiment of the present disclosure, the reflection layer 40 is provided with the light holes 41 corresponding to the light-emitting units 201 one to one. In such case, light emitted by the light-emitting units 201 may be emitted through the light holes 41, so that the display transmittance of the display device may be improved. In addition, the light emitted by the light-emitting units 201 is no more affected by the external light, so that the display contrast of the display device is improved. Moreover, the external light is reflected after irradiating the reflection layer 40 at positions where no light-emitting units are arranged in the display region, so that a mirror function is realized.

Figure 3:
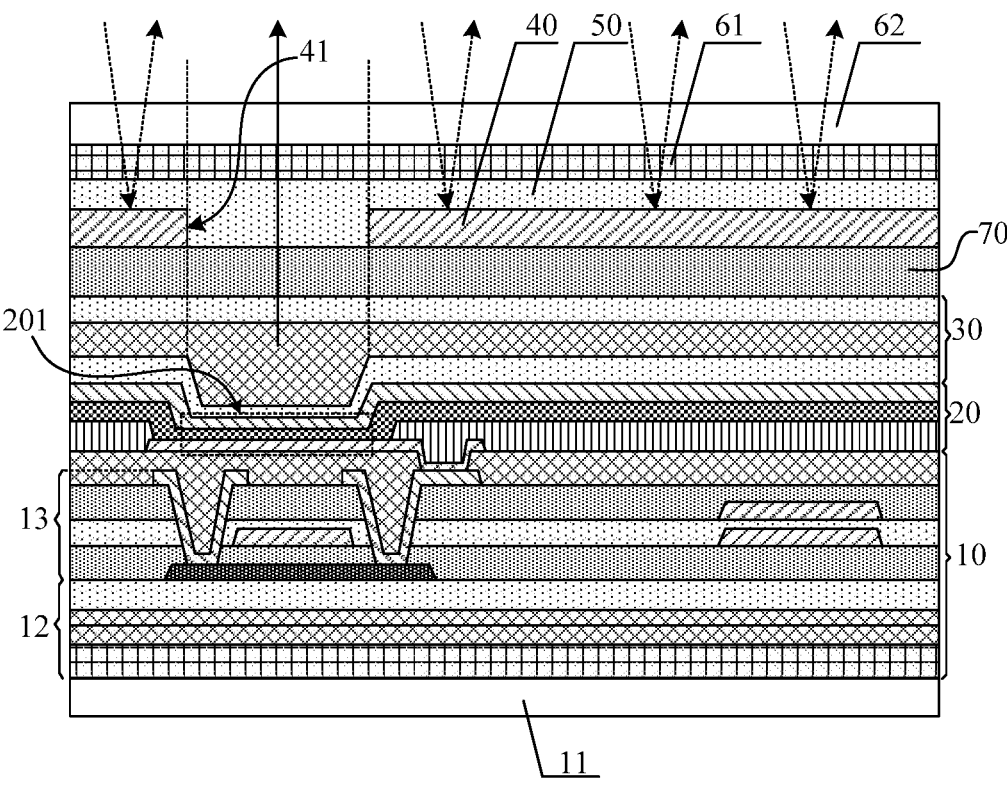
FIG. 3 is a structural schematic diagram of an A-A section of FIG. 1 according to another exemplary embodiment.

FIG. 3 is a structural schematic diagram of an A-A section of FIG. 1 according to another exemplary embodiment. FIG. 3 shows only one light-emitting unit and one thin-film transistor as an example. In an exemplary embodiment, as shown in FIG. 3, the display substrate may further include a protective layer 70 located between the encapsulation structure layer 30 and the reflection layer 40. In an exemplary embodiment, a material of the protective layer 70 may be at least one of Silicon Nitride (SiNx), Silicon Oxide (SiOx), and a SiNx/SiOx composite layer. In an exemplary embodiment, a material of the protective layer 70 is SiNx. A thickness of the protective layer 70 may range from 0.2 μm to 0.4 μm. For example, the thickness of the protective layer 70 may be 0.3 μm.

In an exemplary embodiment, as shown in FIG. 2 or 3, the base substrate 10 may include a base structure layer 12 and a driving structure layer 13 located at a side of the base structure layer 12 facing the light-emitting structure layer 20. In an exemplary embodiment, the base structure layer 12 may include a first base 121, second base 122, third base 123 and buffer layer 124 which are sequentially stacked. The buffer layer 124 faces the driving structure layer 13. In an exemplary embodiment, the base structure layer 12 may include a first base 121, second base 122 and buffer layer 124 which are sequentially stacked. The buffer layer 124 faces the driving structure layer 13.

In an exemplary embodiment, each of the first base, the second base and the third base may be made from at least one of a Pressure Sensitive Adhesive (PSA), Polyimide (PI), Polyethylene Terephthalate (PET), a polymer soft film subjected to surface treatment, and other materials. In an exemplary embodiment, a material of the first base 121 may be a pressure sensitive adhesive. Materials of both the second base 122 and the third base 123 are polyimide. The buffer layer 124 may be made from at least one of Silicon Nitride (SiNx), Silicon Oxide (SiOx), and a SiNx/SiOx composite layer.

In an exemplary embodiment, the driving structure layer 13 may include thin-film transistors. As shown in FIG. 3, FIG. 3 shows only one thin-film transistor 201.

In an exemplary embodiment, as shown in FIG. 1, the display substrate includes multiple pixel units 400 located in the display region 100. The multiple pixel units 400 are arranged in an array. Each pixel unit 400 includes multiple light-emitting units. In an exemplary embodiment, the light-emitting unit is an OLED light-emitting unit. The light-emitting unit may include an anode, an organic light-emitting layer, and a cathode.

In an exemplary embodiment, the pixel unit 400 includes a first light-emitting unit 401, a second light-emitting unit 402, and a third light-emitting unit 403. The three light-emitting units may be arranged in an array. Each light-emitting unit may be of a rectangular structure, as shown in FIG. 1. Those skilled in the art should know that an arrangement mode of the three light-emitting units and a structure and size of each light-emitting unit may be determined as practically required and will not be limited herein. In an exemplary embodiment, the first light-emitting unit 401 may be configured to be a red light emitting unit. The second light-emitting unit 402 may be configured to be a green light emitting unit. The third light-emitting unit 403 may be configured to be a blue light emitting unit. Those skilled in the art should know that a color of each light-emitting unit in the pixel unit 400 may be determined as practically required and will not be limited herein.

In an exemplary embodiment, the pixel unit 400 may include four or more light-emitting units. No limits are made herein. An arrangement mode of multiple light-emitting units and a shape, size and color of each light-emitting unit may be determined as practically required and will not be limited herein.

In an exemplary embodiment, each light-emitting unit may use the same organic light-emitting layer. Therefore, each light-emitting unit emits light of the same color, e.g., white light. The light-emitting unit may be combined with a color film to obtain light of a desired color. For example, white light and a red color film are combined to obtain a red light emitting unit. White light and a blue color film are combined to obtain a blue light emitting unit. White light and a green light color film are combined to obtain a green light-emitting unit.

In an exemplary embodiment, the organic light-emitting layer may be configured to emit red light, green light and blue light respectively. Therefore, the light-emitting unit may emit light without the assistance of any color film as a red light emitting unit, a green light emitting unit and a blue light emitting unit respectively.

In an exemplary embodiment, as shown in FIG. 2 or 3, the base substrate 10 may include a base structure layer 12 and a driving structure layer 13. The driving structure layer 13 is located at a side of the base structure layer facing the light-emitting structure layer 20. The base structure layer 12 includes a first base, second base, third base and buffer layer which are sequentially stacked. The driving structure layer 13 is located at a side of the buffer layer away from the first base. In an exemplary embodiment, each of the first base, the second base and the third base includes at least one of the following materials: a pressure sensitive adhesive, polyimide, polyethylene terephthalate, and a polymer soft film subjected to surface treatment.

In an exemplary embodiment, the display substrate of the embodiment of the present disclosure may be a flexible OLED mirror display substrate with both display and mirror functions.

The structure of the display substrate of the embodiment of the present disclosure will now be described through a manufacturing process of the display substrate. In order to describe a masking count of the display substrate in detail, "patterning process" is used to represent each process of forming a pattern hereinafter. Each patterning process corresponds to a masking process. For an inorganic material (e.g., a metal layer and an inorganic layer), a "patterning process" may include coating with a photo-resist, masking exposure, development, etching, and stripping of the photo-resist. For an organic material (e.g., a photo-resist and an organic resin), a "patterning process" may include masking exposure and development treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made from a certain material on a base by a deposition or coating process. If no patterning process is needed by the "thin film" in the whole making process, the "thin film" may also be called a "layer". When the patterning process is needed by the "thin film" in the whole making process, the thin film is called a "thin film" before the patterning process and called a "layer" after the patterning process. The "layer" after the patterning process includes at least one "pattern". "A and B are arranged in the same layer" mentioned in the present disclosure refers to that A and B are simultaneously formed by the same patterning process. The "thickness" of a film layer is a dimension of the film layer in a direction perpendicular to the substrate.

Figure 4:
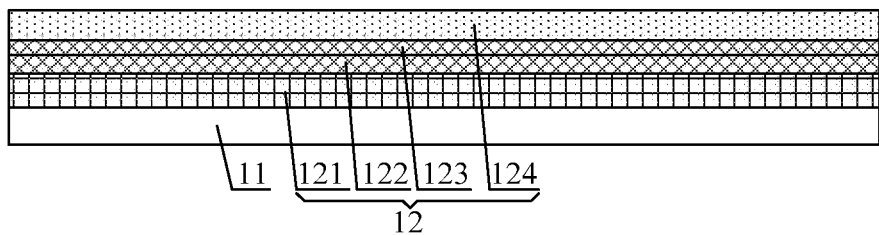
FIG. 4 is a sectional structural schematic diagram after a base structure layer is formed in a display substrate.

At (1), a base structure layer 12 is formed. This step may include the following operations. A hard carrier plate 11 is coated with a first flexible material, and a film is formed by curing so as to form a first base 121. A side of the first base 121 away from the hard carrier plate 11 is coated with a second flexible material, and a film is formed by curing so as to form a second base 122. A side of the second base 122 away from the hard carrier plate 11 is coated with a third flexible material, and a film is formed by curing so as to form a third base 123. A buffer thin film is deposited at a side of the third base 123 away from the hard carrier plate 11 so as to form a buffer layer 124, as shown in FIG. 4. FIG. 4 is a sectional structural schematic diagram after the base structure layer is formed in the display substrate. As shown in FIG. 4, the formed base structure layer includes the first base 121, second base 122, third base 123 and buffer layer 124 which are sequentially stacked on the hard carrier plate 11.

In an exemplary embodiment, the base structure layer 12 may include the first base 121, second base 122 and buffer layer 124 which are sequentially stacked on the hard carrier plate 11. In an exemplary embodiment, each of the first flexible material, the second flexible material and the third flexible material may be at least one of a Pressure Sensitive Adhesive (PSA), Polyimide (PI), Polyethylene Terephthalate (PET), a polymer soft film subjected to surface treatment, and other materials. The first flexible material, the second flexible material and the third flexible material may be the same material or different materials. In an exemplary embodiment, a material of the first base 121 may be a pressure sensitive adhesive. Materials of both the second base 122 and the third base 123 are polyimide. The buffer layer 124 may be made from at least one of Silicon Nitride (SiNx), Silicon Oxide (SiOx), or a SiNx/SiOx composite layer.

No patterning process is used when the base structure layer 12 is formed.

Figure 5:
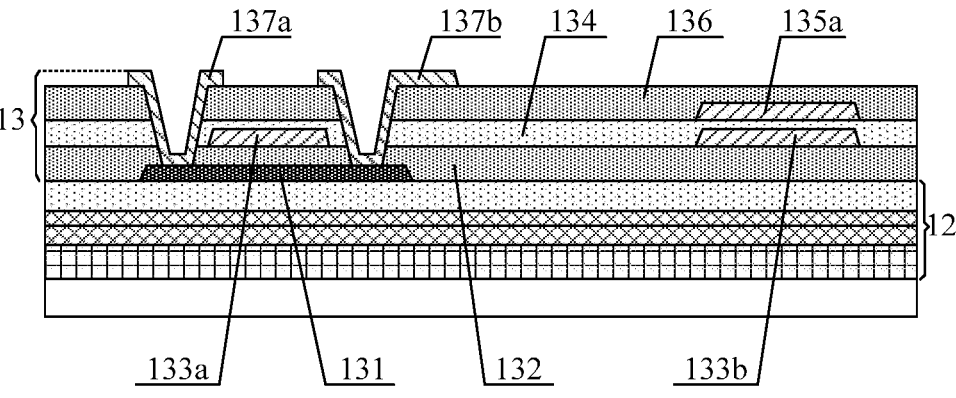
FIG. 5 is a sectional structural schematic diagram after a driving structure layer is formed in a display substrate.

At (2), a driving structure layer is formed on the base structure layer 12, as shown in FIG. 5. FIG. 5 is a sectional structural schematic diagram after the driving structure layer is formed in the display substrate. The driving structure layer includes thin-film transistors. The formation of the driving structure layer may include the following operations.

A first patterning process is performed. That is, an active layer 131 is formed on the base structure layer 12. The active layer 131 is located in a display region. This step may include the following operations. An active thin film is deposited at a side of the buffer layer 124 away from the hard carrier plate 11. The active thin film is patterned through a patterning process so as to form the active layer 131, as shown in FIG. 5. In an exemplary embodiment, a material of the active thin film may be Low Temperature Poly-Silicon (LPTS) or microcrystalline silicon, or may be a metal oxide. The metal oxide may be Indium Gallium Zinc Oxide (IGZO) or Indium Tin Zinc Oxide (ITZO).

A second patterning process is performed. That is, a first metal layer is formed at a side of the active layer 131 away from the base structure layer 12. This step may include the following operations. A first insulation thin film is deposited at the side of the active layer 131 away from the base structure layer so as to form a first insulation layer 132. A first metal thin film is deposited at a side of the first insulation layer 132 away from the base structure layer. The first metal thin film is patterned through a patterning process so as to form the first metal layer. The first metal layer includes a gate electrode 133a, a first pattern 133b, and a gate line (not shown in the figure). Both the gate electrode 133a and the first pattern 133b are located in the display region. In an exemplary embodiment, the first metal thin film may be made from one or more of metals such as Platinum (Pt), Ruthenium (Ru), Aurum (Au), Argentum (Ag), Molybdenum (Mo), Chromium (Cr), Aluminum (Al), Tantalum (Ta), Titanium (Ti), and Wolfram (W). The first insulation thin film may be made from at least one of Silicon Nitride (SiNx), Silicon Oxide (SiOx), and a SiNx/SiOx composite layer.

A third patterning process is performed. That is, a second metal layer is formed at a side of the first metal layer away from the base structure layer 12. This step may include the following operations. A second insulation thin film is deposited at the side of the first metal layer away from the base structure layer 12 so as to form a second insulation layer 134. A second metal thin film is deposited at a side of the second insulation layer 134 away from the base structure layer 12. The second metal thin film is patterned through a patterning process so as to form the second metal layer. The second metal layer includes a second pattern 135a located in the display region, as shown in FIG. 5. The second pattern 135a corresponds to the first pattern 133b. The second pattern 135a and the first pattern 133b form two polar plates of a capacitor. In an exemplary embodiment, the second metal thin film may be made from one or more of metals such as Platinum (Pt), Ruthenium (Ru), Aurum (Au), Argentum (Ag), Molybdenum (Mo), Chromium (Cr), Aluminum (Al), Tantalum (Ta), Titanium (Ti), and Wolfram (W). The second insulation thin film may be made from at least one of Silicon Nitride (SiNx), Silicon Oxide (SiOx), and a SiNx/SiOx composite layer.

A fourth patterning process is performed. That is, a third insulation layer 136 is formed at a side of the second metal layer away from the base structure layer 12. The third insulation layer 136 is provided with a first via and second via which penetrate through the third insulation layer 136, the second insulation layer 134 and the first insulation layer 132. The first via is arrange to expose one end of the active layer 131. The second via is configured to expose the other end of the active layer 131. This step may include the following operations. A third insulation thin film is deposited at the side of the second metal layer away from the base structure layer 12. The third insulation thin film, the second insulation layer 134 and the first insulation layer 132 are patterned through a patterning process so as to form the first via and the second via. The first via exposes one end of the active layer 131. The second via exposes the other end of the active layer 131, as shown in FIG. 5. In an exemplary embodiment, the third insulation thin film may be made from at least one of Silicon Nitride (SiNx), Silicon Oxide (SiOx), and a SiNx/SiOx composite layer.

A fifth patterning process is performed. That is, a third metal layer is formed at a side of the third insulation layer 136 away from the base structure layer 12. The third metal layer includes a source electrode 137a and a drain electrode 137b. The source electrode 137a is connected with one end of the active layer 131 through the first via. The drain electrode 137b is connected with the other end of the active layer 131 through the second via. Both the source electrode 137a and the drain electrode 137b are located in the display region. This step may include the following operations. A third metal thin film is deposited at the side of the third insulation layer 136 away from the base structure layer 12. The third metal thin film is patterned through a patterning process so as to form the third metal layer. The third metal layer includes the source electrode 137a, drain electrode 137b and data line (not shown in the figure) which are located in the display region. The source electrode 137a is connected with one end of the active layer 131 through the first via. The drain electrode 137b is connected with the other end of the active layer 131 through the second via.

Figure 6:
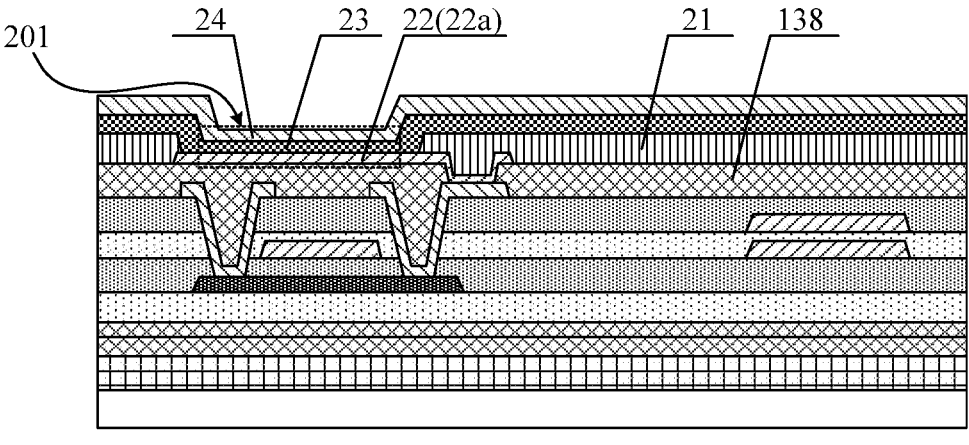
FIG. 6 is a sectional structural schematic diagram after a light-emitting structure layer is formed in a display substrate.

At (3), a light-emitting structure layer is formed at a side of the driving structure layer away from the base structure layer 12, as shown in FIG. 6. FIG. 6 is a sectional structural schematic diagram after the light-emitting structure layer is formed in the display substrate. The light-emitting structure layer includes multiple light-emitting units 201 located in the display region 100. The light-emitting unit includes a first electrode pattern, an organic light-emitting layer, and a second electrode layer. The formation of the light-emitting structure layer may include the following operations.

A sixth patterning process is performed. That is, a fourth insulation layer 138 is formed at a side of the driving structure layer away from the base structure layer 12. The fourth insulation layer 138 is provided with a third via configured to expose the drain electrode 137b. This step may include the following operations. The side of the driving structure layer away from the base structure layer 12 is coated with a fourth insulation thin film. The fourth insulation thin film is patterned through a patterning process so as to form the fourth insulation layer 138. The fourth insulation layer 138 is provided with the third via. The drain electrode 137b is exposed from the third via, as shown in FIG. 6. In an exemplary embodiment, a material of the fourth insulation layer is an organic material, e.g., a photo-resist or a resin material. The fourth insulation layer is also called a flattened layer. A surface of a side of the fourth insulation layer away from the base structure layer is a flat surface.

A seventh patterning process is performed. That is, a first electrode layer 22 is formed at a side of the fourth insulation layer 138 away from the base structure layer 12. The first electrode layer 22 includes first electrode patterns 22a in a region where the light-emitting units are located. This step may include the following operations. A first conductive thin film is deposited at a side of the fourth insulation layer 138 away from the base structure layer 12. The first conductive thin film is patterned through a patterning process so as to form the first electrode layer 22. The first electrode layer 22 includes multiple first electrode patterns 22a. The first electrode pattern 22a is located in a region where the light-emitting units are located. The first electrode pattern 22a is connected with the drain 137b through the third via, as shown in FIG. 6. The first conductive thin film may be made from a common material in the present field, e.g., Indium Tin Oxide (ITO), Indium Zinc Oxide (IZO), or an ITO/Aluminum (Al)/ITO multilayer composite. No limits are made herein. The first electrode pattern 22a may be an anode of the OLED light-emitting unit.

An eighth patterning process is performed. That is, a pixel definition layer 21 is formed at a side of the first electrode layer 22 away from the base structure layer 12. The pixel definition layer 22 is provided with a pixel opening in a region where each light-emitting unit is located. The first electrode pattern 22a is exposed from the pixel opening. This step may include the following operations. A pixel definition thin film is formed at the side of the first electrode layer 22 away from the base structure layer 12. The pixel definition thin film is patterned through a patterning process so as to form the pixel definition layer 21. The pixel definition layer 21 is provided with a pixel opening in a region where each light-emitting unit is located. The first electrode pattern 22a is exposed from the pixel opening, as shown in FIG. 6. In an exemplary embodiment, the pixel definition layer may be made from a material such as polyimide, acrylic, or polyethylene terephthalate.

An organic light-emitting material and a second conductive material are sequentially deposited at the side of the first electrode layer 22 away from the base structure layer 12 so as to form the organic light-emitting layer 23 and the second electrode layer 24. The organic light-emitting layer 23 is connected with the first electrode pattern 22a. The second electrode layer 24 is located on a surface of a side of the organic light-emitting layer 23 away from the base structure layer 12, as shown in FIG. 6. The organic light-emitting layer 23 mainly includes an Emission Layer (EML). The organic light-emitting layer may include a hole injection layer, hole transport layer, emission layer, electron transport layer and electron injection layer which are sequentially arranged. In order to improve the efficiency of the electron and hole injection layers and the emission layer, the second conductive material may use one or more of metal materials such as Magnesium (Mg), Argentum (Ag), Aluminum (Al), Copper (Cu), and Lithium (Li). The second electrode layer may be a cathode of the light-emitting unit. Cathodes of all the light-emitting units are integrated.

Those skilled in the art may understand that the formation of the light-emitting structure layer further includes a ninth patterning process. A Photo Spacer (PS) located in a border region is formed in the ninth patterning process.

Figure 7:
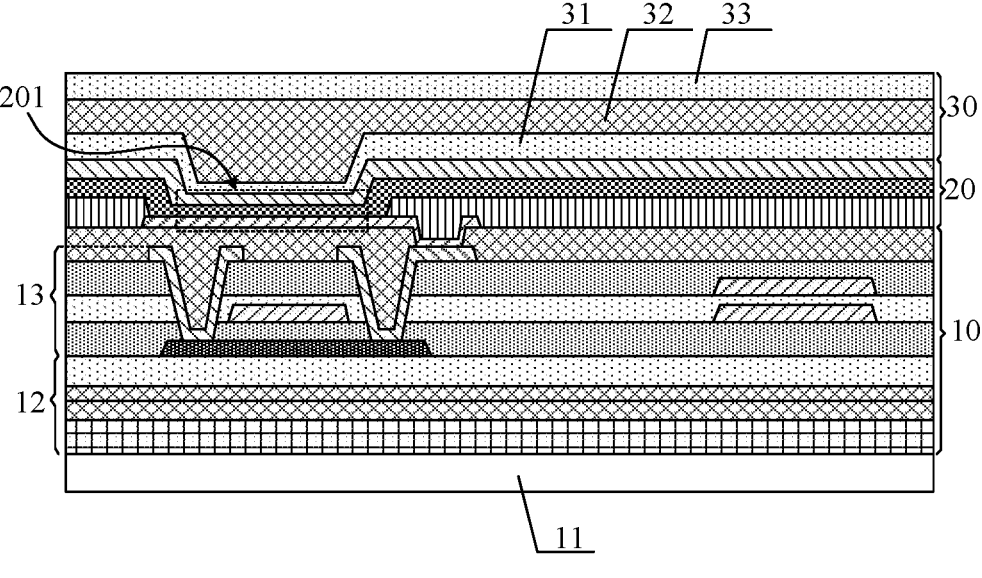
FIG. 7 is a sectional structural schematic diagram after an encapsulation structure layer is formed in a display substrate.

At (4), an encapsulation structure layer 30 is formed at a side of the light-emitting structure layer 20 away from the base structure layer 12, as shown in FIG. 7. FIG. 7 is a sectional structural schematic diagram after the encapsulation structure layer is formed in the display substrate. The encapsulation structure layer 30 includes a first inorganic encapsulation layer 31, an organic encapsulation layer 32, and a second inorganic encapsulation layer 33. An orthographic projection of each of the first inorganic encapsulation layer 31, the organic encapsulation layer 32 and the second inorganic encapsulation layer 33 on the base structure layer 12 includes the display region. In an exemplary embodiment, both the first inorganic encapsulation layer 31 and the second inorganic encapsulation layer 33 are located in the display region and the border region. The organic encapsulation layer 32 is located in the display region. A process of forming the encapsulation structure layer 30 may include the following operations.

The first inorganic encapsulation layer 31 is formed at the side of the light-emitting structure layer 20 away from the base structure layer 12. This step may include the following operations. A first inorganic encapsulation thin film is deposited at the side of the light-emitting structure layer 20 away from the base structure layer 12 so as to form the first inorganic encapsulation layer 31. The first inorganic encapsulation layer 31 is located in the display region and the border region. In an exemplary embodiment, the first inorganic encapsulation thin film may be made from at least one of Silicon Nitride (SiNx), Silicon Oxide (SiOx), and a SiNx/SiOx composite layer. In an exemplary embodiment, the first inorganic encapsulation thin film is made from Silicon Oxynitride (SiON).

The organic encapsulation layer 32 is formed at a side of the first inorganic encapsulation layer 31 away from the base structure layer 12. This step may include the following operations. An organic encapsulation material is ink-jet printed at the side of the first inorganic encapsulation layer 31 away from the base structure layer 12 by an ink-jet printing process. A film is formed by curing so as to form the organic encapsulation layer 32. The organic encapsulation layer 32 may be ink-jet printed in the display region only.

The second inorganic encapsulation layer 33 is formed at a side of the organic encapsulation layer 32 away from the base structure layer 12. This step may include the following operations. A second inorganic encapsulation thin film is deposited at the side of the organic encapsulation layer 32 away from the base structure layer 12 so as to form the second inorganic encapsulation layer 33. The second inorganic encapsulation layer 33 is located in the display region and the border region. In an exemplary embodiment, the second inorganic encapsulation thin film may be made from at least one of Silicon Nitride (SiNx), Silicon Oxide (SiOx), and a SiNx/SiOx composite layer. In an exemplary embodiment, the second inorganic encapsulation thin film is made from Silicon Nitride (SiNx).

In an exemplary embodiment, a thickness of the first inorganic encapsulation layer 31 may be 1 μm. A thickness of the organic encapsulation layer 32 may be 12 μm. A thickness of the second inorganic encapsulation layer 33 may range from 500 nm to 700 nm (e.g., 600 nm).

Figure 8A:
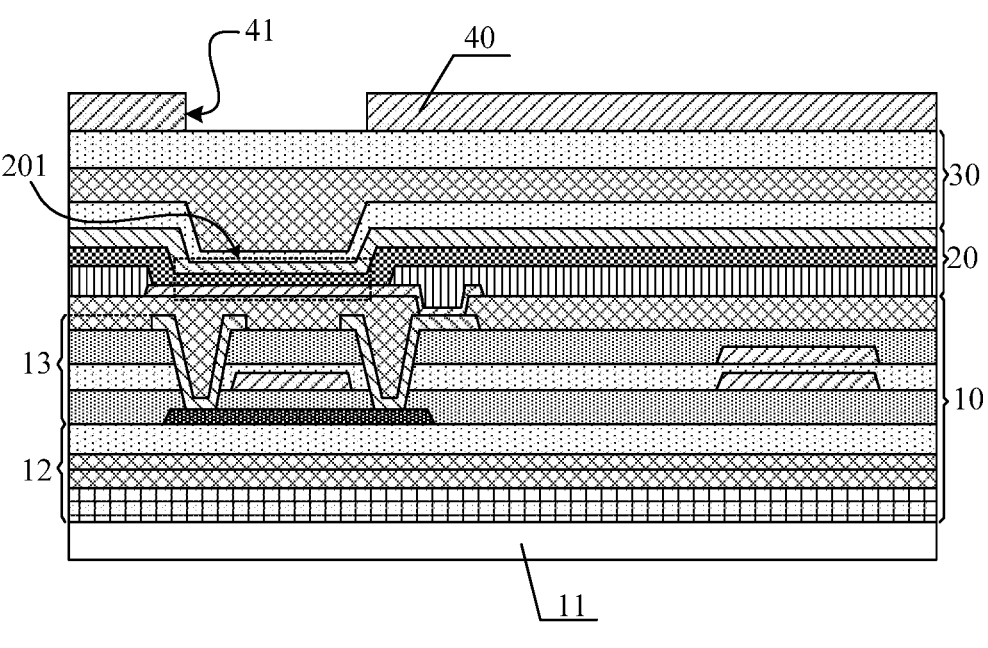
FIG. 8a is a sectional structural schematic diagram after a reflection layer is formed in a display substrate.
Figure 8B:
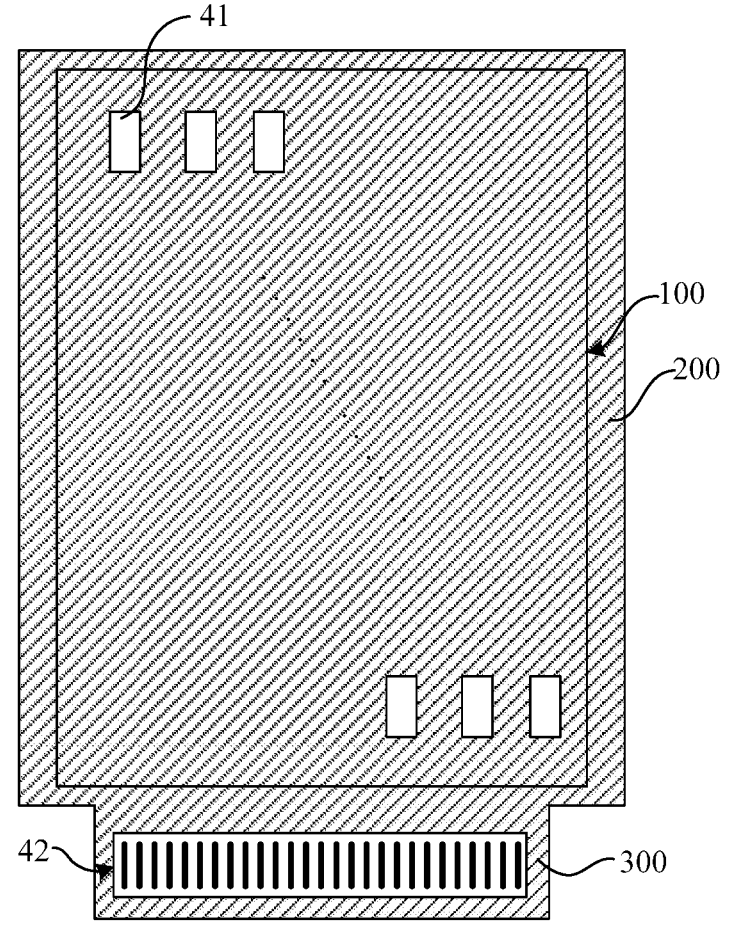
FIG. 8b is a structural schematic top view after a reflection layer is formed in a display substrate.

At (5), a tenth patterning process is performed. That is, a reflection layer 40 is formed at a side of the encapsulation structure layer 30 away from the base structure layer 12. The reflection layer 40 is provided with light holes 41 corresponding to the light-emitting units one to one. The reflection layer 40 is further provided with a first exposure hole 42. The first exposure hole 42 is located in a bonding region. The first exposure hole is configured to expose a bonding pad for bonding connection with a driver IC and a flexible circuit board, as shown in FIGS. 8a and 8b. FIG. 8a is a sectional structural schematic diagram after the reflection layer is formed in the display substrate. FIG. 8b is a structural schematic top view after the reflection layer is formed in the display substrate. This step may include the following operations. A reflective thin film is deposited at the side of the encapsulation structure layer 30 away from the base structure layer 12. The reflective thin film is patterned through a patterning process so as to form the light holes 41 corresponding to the light-emitting units one to one and the first exposure hole located in the bonding region. Light emitted by the light emitting unit may be emitted through the light hole 41. The first exposure hole is configured to expose the bonding pad for bonding connection with the driver IC and the flexible circuit board.

In an exemplary embodiment, an area of all the light holes 41 in the reflection layer 40 is 10% to 40% of that of the display region of the display substrate. That is, an area of an orthographic projection of the reflection layer 40 on a plane parallel to the display substrate is 60% to 90% of that of the display region of the display substrate. The area of the light hole 41 and the area of the light-emitting unit are not limited (it may be understood that, since the light-emitting unit includes multiple film layers, the area of the light-emitting unit is an area of an orthographic projection of the light-emitting layer on the base structure layer and an area of the pixel opening corresponding to the light-emitting unit). The area of the light hole 41 may be larger than, smaller than or equal to that of the light-emitting unit. Enlarging the area of the light hole 41 may weaken a mirror effect but improve the brightness of the display substrate. Reducing the area of the light hole 41 may enhance the mirror effect but reduce the brightness of the display substrate. A shape of the light hole 41 is not limited herein, and may be set to be a square, a round, a shape consistent with that of the light-emitting unit or the like as practically required.

In an exemplary embodiment, an orthographic projection of the reflection layer on the base structure layer covers all regions except the light-emitting units in the display region of the display substrate. That is, all the light-emitting units are exposed.

In an exemplary embodiment, a material of the reflection layer may include one or more of Molybdenum (Mo), Aluminum (Al), Argentum (Ag), Titanium (Ti), an ITO/Ag/ITO multilayer composite, and a Ti/Al/Ti multilayer composite. In an exemplary embodiment, a thickness of the reflection layer may range from 0.25 μm to 0.4 μm. In an exemplary embodiment, a material of the reflection layer is aluminum, while a thickness is 0.33 μm.

In an exemplary embodiment, an orthographic projection of the reflection layer 40 on the base structure layer includes that of the encapsulation structure layer 30 on a base substrate. Therefore, the whole encapsulation structure layer 30 is covered by the reflection layer 40, and the mirror effect is improved.

Figure 9A:
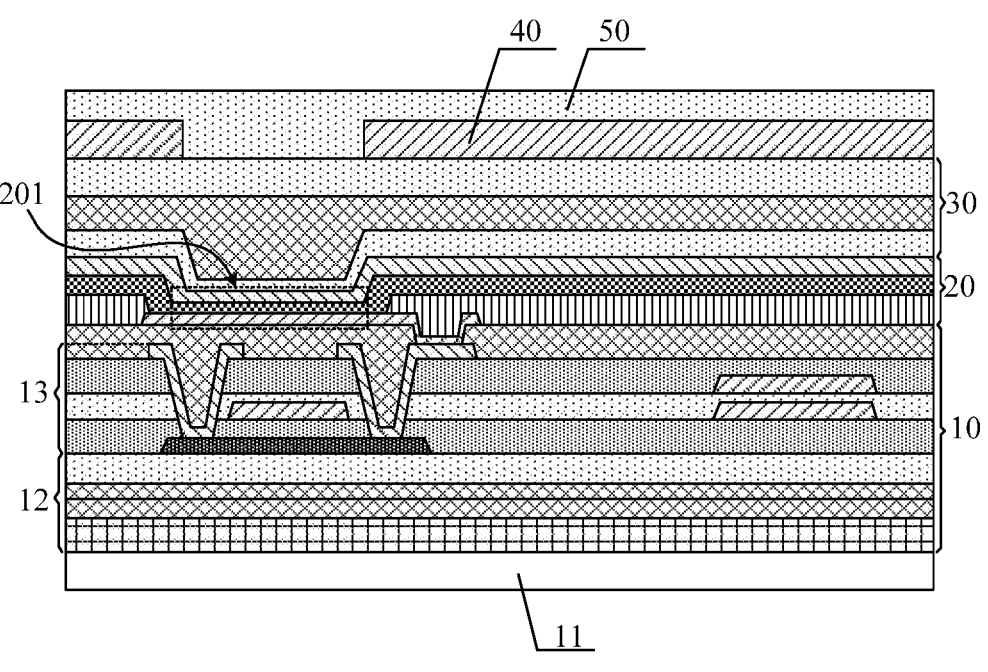
FIG. 9a is a sectional structural schematic diagram after a hydrophilic material layer is formed in a display substrate.
Figure 9B:
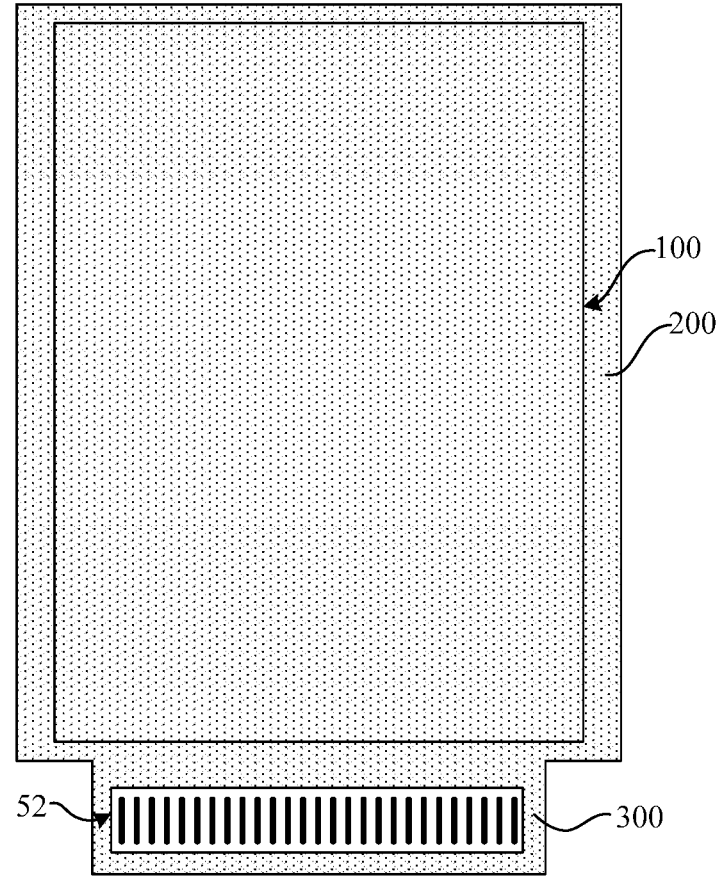
FIG. 9b is a structural schematic top view after a hydrophilic material layer is formed in a display substrate.

At (6), an eleventh patterning process is performed. That is, a hydrophilic layer 50 is formed at a side of the reflection layer 40 away from the base structure layer 12. The hydrophilic material layer 50 is provided with a second exposure hole 52. The second exposure hole 52 is located in the bonding region. The second exposure hole 52 is configured to expose the bonding pad for bonding connection with the driver IC and the flexible circuit board, as shown in FIGS. 9a and 9b. FIG. 9a is a sectional structural schematic diagram after the hydrophilic material layer is formed in the display substrate. FIG. 9b is a structural schematic top view after the hydrophilic material layer is formed in the display substrate. This step may include the following operations. A hydrophilic material thin film is formed at the side of the reflection layer 40 away from the base structure layer 12. The hydrophilic material thin film is patterned through a patterning process so as to form the hydrophilic material layer 50. The hydrophilic material layer 50 is provided with the second exposure hole 52 located in the bonding region. The second exposure hole 52 is configured to expose the bonding pad for bonding connection with the driver IC and the flexible circuit board, as shown in FIGS. 8a and 8b. Those skilled in the art may understand that materials at corresponding positions of the first inorganic encapsulation layer and the second inorganic encapsulation layer are removed at the same time of forming the second exposure hole 52, thereby exposing the bonding pad from the second exposure hole.

In an exemplary embodiment, the hydrophilic material layer may be made from a silicon-series super-hydrophilic oxide such as Silicon Dioxide ($SiO_2$), or a hydrophilic Organic Colloid (OC) such as a transparent photo-resist. In an exemplary embodiment, a thickness of the hydrophilic material layer may range from 1,200 angstroms to 1,700 angstroms, such as 1,500 angstroms.

In an exemplary embodiment, an orthographic projection of the hydrophilic material layer 50 on the base substrate includes that of the reflection layer on the base substrate. That is, the hydrophilic material layer covers the reflection layer. Therefore, the hydrophilic material layer may protect the whole reflection layer to avoid the reflection layer being damaged by bad pressure during the lamination of an optical adhesive layer 61.

At (7), an optical adhesive layer 61 is laminated to a side of the hydrophilic material layer 50 away from the base structure layer 12 by a lamination process, as shown in FIG. 2.

Since the optical adhesive layer 61 is laminated to a surface of the hydrophilic material layer 50, compared with the lamination of the optical adhesive layer 61 to the reflection layer 40, the hydrophilic material layer 50 may improve the adhesive power of the optical adhesive layer 61 on the surface of the hydrophilic material layer 50 and avoid bubbles, separation and other undesirable phenomena at an interface between the optical adhesive layer 61 and the hydrophilic material layer 50. In addition, the hydrophilic material layer 50 may protect the reflection layer 40 to avoid the reflection layer being damaged by bad pressure during the lamination of the optical adhesive layer 61. Therefore, the lamination and reliability yield of back-end modules is improved greatly.

Then, a cover plate 62 is laminated to a side of the optical adhesive layer 61 away from the base structure layer by a lamination process.

In an exemplary embodiment, a thickness of the optical adhesive layer may range from 40 μm to 60 μm, such as 50 μm. A thickness of the cover plate may range from 50 μm to 70 μm, such as 60 μm.

Those skilled in the art may understand that the manufacturing process of the display substrate further includes the stripping of the hard carrier plate 11 when the flexible display substrate is manufactured. The hard carrier plate 11 may be stripped by use of known processes and methods in the present field.

In an exemplary embodiment, the manufacturing process of the display substrate may further include that a protective layer 70 is formed between the encapsulation structure layer 30 and the reflection layer 40. This step may include the following operations. A protective thin film is formed at a side of the encapsulation structure layer 30 facing the reflection layer 40. The protective thin film is patterned through a patterning process so as to form the protective layer 70. The protective layer 70 is provided with a third exposure hole located in the bonding region. The third exposure hole is configured to expose the bonding pad for bonding connection with the driver IC and the flexible circuit board, as shown in FIG. 3. Since the protective layer 70 needs to be patterned, a masking process is also needed when the protective layer is formed. In an exemplary embodiment, a material of the protective layer 70 may be at least one of Silicon Nitride (SiNx), Silicon Oxide (SiOx), and a SiNx/SiOx composite layer. In an exemplary embodiment, a material of the protective layer 70 is SiNx. A thickness of the protective layer 70 may range from 0.2 μm to 0.4 μm. For example, the thickness of the protective layer 70 may be 0.2 μm, 0.3 μm, or 0.4 μm.

In an exemplary embodiment, an orthographic projection of the protective layer 70 on the base substrate includes that of the encapsulation structure layer 30 on the base substrate. Therefore, the protective layer 70 may protect the whole encapsulation structure layer to prevent the encapsulation structure layer from being etched when the reflection layer is patterned.

An embodiment of the present disclosure also provides a manufacturing method for a display substrate. FIG. 12 is a schematic diagram of a manufacturing method for a display substrate according to an exemplary embodiment of the present disclosure. As shown in FIG. 12, the manufacturing method for the display substrate may include the following operations.

A light-emitting structure layer is formed at a side of a base substrate. Herein, the light-emitting structure layer includes multiple light-emitting units.

An encapsulation structure layer is formed at a side of the light-emitting structure layer away from the base substrate.

A reflection layer is formed at a side of the encapsulation structure layer away from the base substrate.

A hydrophilic material layer is formed at a side of the reflection layer away from the base substrate.

An optical adhesive layer is laminated to a side of the hydrophilic material layer away from the base substrate.

In an exemplary embodiment, the display substrate includes a display region, a border region located on a periphery of the display region, and a bonding region. The operation that a hydrophilic material layer is formed at a side of the reflection layer away from the base substrate includes the following operations.

A hydrophilic material thin film located in the display region, the border region and the bonding region is formed at the side of the reflection layer away from the base substrate.

The hydrophilic material thin film is patterned through a patterning process to form the hydrophilic material layer. Herein, the hydrophilic material layer is provided with a second exposure hole located in the bonding region and configured to expose a bonding pad of the bonding region.

A detailed manufacturing process of the display substrate has been described above in detail, and will not be elaborated herein.

An embodiment of the present disclosure also provides a display device, which includes the display substrate of the above-mentioned embodiment. The display device may be a flexible OLED mirror display device. The display device may be any product or component with a display function, such as a mobile phone, a tablet computer, a television, a display, a notebook computer, a digital photo frame, and a navigator.

Although the implementation modes of the present disclosure are disclosed above, the contents are only implementation modes adopted to easily understand the present disclosure and not intended to limit the present disclosure. Those skilled in the art may make any modifications and variations to implementation forms and details without departing from the spirit and scope disclosed by the present disclosure. However, the patent protection scope of the present disclosure should also be subject to the scope defined by the appended claims.

The invention claimed is:

1. A flexible mirror display substrate, comprising: a display region, a border region located on a periphery of the display region, and a bonding region;

wherein the flexible mirror display substrate comprises a base substrate; the display region comprises:

a light-emitting structure layer, located at a side of the base substrate and comprising multiple light-emitting units;

an encapsulation structure layer, located at a side of the light-emitting structure layer away from the base substrate;

wherein the flexible mirror display substrate further comprises: a reflection layer covering the display region, the border region and the bonding region, a hydrophilic material layer covering the display region, the border region and the bonding region and an optical adhesive layer covering the display region, the border region and the bonding region;

wherein the reflection layer is located at a side of the encapsulation structure layer away from the base substrate, a thickness of the reflection layer ranges from 0.25 μm to 0.4 μm; wherein the reflection layer is made of one or more of the following materials: molybdenum, aluminum, argentum, titanium, an indium tin oxide/argentum/indium tin oxide multilayer composite, and a titanium/aluminum/titanium multilayer composite;

the hydrophilic material layer is located at a side of the reflection layer away from the base substrate; and the optical adhesive layer is located at a side of the hydrophilic material layer away from the base substrate;

wherein the reflection layer is provided with light holes located in the display region and corresponding to the light-emitting units one to one, and a first exposure hole located in the bonding region and configured to expose a bonding pad of the bonding region; wherein the hydrophilic material layer is made of an inorganic material and covers the reflection layer and the light holes, and is provided with a second exposure hole located in the bonding region and configured to expose the bonding pad of the bonding region.

2. The display substrate according to claim 1, wherein a material of the hydrophilic material layer comprises a silicon-series super-hydrophilic oxide.

3. The display substrate according to claim 1, wherein a thickness of the hydrophilic material layer ranges from 1,200 angstroms to 1,700 angstroms.

4. The display substrate according to claim 1, wherein an orthographic projection of the hydrophilic material layer on the base substrate comprises that of the reflection layer on the base substrate; and the orthographic projection of the reflection layer on the base substrate comprises that of the encapsulation structure layer on the base substrate.

5. The display substrate according to claim 1, further comprising a protective layer located between the encapsulation structure layer and the reflection layer, wherein a material of the protective layer comprises at least one of the following materials: silicon nitride, silicon oxide, and a silicon nitride/silicon oxide composite layer.

6. The display substrate according to claim 5, wherein a thickness of the protective layer ranges from 0.2 μm to 0.4 μm.

7. The display substrate according to claim 5, wherein an orthogonal projection of the protective layer on the base substrate comprises that of the encapsulation structure layer on the base substrate.

8. The display substrate according to claim 5, wherein the encapsulation structure layer comprises a first inorganic encapsulation layer, organic encapsulation layer and second inorganic encapsulation layer which are sequentially stacked at the side of the light-emitting structure layer away from the base substrate.

9. The display substrate according to claim 1, wherein the base substrate comprises a base structure layer and a driving structure layer located at a side of the base structure layer facing the light-emitting structure layer;

the base structure layer comprises a first base, second base, third base and buffer layer which are sequentially stacked;

the driving structure layer is located at a side of the buffer layer away from the first base; and each of the first base, the second base and the third base comprises at least one of the following materials: a pressure sensitive adhesive, polyimide, polyethylene terephthalate, and a polymer soft film subjected to surface treatment.

10. A display device, comprising the display substrate according to claim 1.

11. The display substrate according to claim 2, further comprising a protective layer located between the encapsulation structure layer and the reflection layer, wherein a material of the protective layer comprises at least one of the following materials: silicon nitride, silicon oxide, and a silicon nitride/silicon oxide composite layer.

12. The display substrate according to claim 3, further comprising a protective layer located between the encapsulation structure layer and the reflection layer, wherein a material of the protective layer comprises at least one of the following materials: silicon nitride, silicon oxide, and a silicon nitride/silicon oxide composite layer.

13. The display substrate according to claim 4, further comprising a protective layer located between the encapsulation structure layer and the reflection layer, wherein a material of the protective layer comprises at least one of the following materials: silicon nitride, silicon oxide, and a silicon nitride/silicon oxide composite layer.

14. A manufacturing method for a flexible mirror display substrate comprising a display region, a border region located on a periphery of the display region, and a bonding region; the manufacturing method comprising:

forming a light-emitting structure layer at a side of a base substrate, the light-emitting structure layer comprising multiple light-emitting units;

forming an encapsulation structure layer at a side of the light-emitting structure layer away from the base substrate;

forming a reflection layer at a side of the encapsulation structure layer away from the base substrate; wherein the reflection layer covers the display region, the border region and the bonding region, a thickness of the reflection layer ranges from 0.25 μm to 0.4 μm; wherein the reflection layer is made of one or more of the following materials: molybdenum, aluminum, argentum, titanium, an indium tin oxide/argentum/indium tin oxide multilayer composite, and a titanium/aluminum/titanium multilayer composite;

forming a hydrophilic material layer at a side of the reflection layer away from the base substrate with an inorganic material, wherein the hydrophilic material layer covers the display region, the border region and the bonding region; and laminating an optical adhesive layer to a side of the hydrophilic material layer away from the base substrate; wherein the optical adhesive layer covers the display region, the border region and the bonding region;

wherein the reflection layer is provided with light holes located in the display region and corresponding to the light-emitting units one to one, and a first exposure hole located in the bonding region and configured to expose a bonding pad of the bonding region;

wherein the forming a hydrophilic material layer at a side of the reflection layer away from the base substrate comprises:

forming a hydrophilic material thin film located in the display region, the border region and the bonding region at the side of the reflection layer away from the base substrate, and patterning the hydrophilic material thin film through a patterning process to form the hydrophilic material layer, the hydrophilic material layer being provided with a second exposure hole located in the bonding region and configured to expose the bonding pad of the bonding region.

* * * * *